United States Patent
Wong et al.

(10) Patent No.: US 7,425,734 B2
(45) Date of Patent: Sep. 16, 2008

(54) THIN-FILM TRANSISTOR ARRAY WITH RING GEOMETRY

(75) Inventors: William S. Wong, San Carlos, CA (US); Jeng Ping Lu, Mountain View, CA (US); Alberto Salleo, San Francisco, CA (US); Michael L. Chabinyc, Mountain View, CA (US); Raj B. Apte, Palo Alto, CA (US); Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 171 days.

(21) Appl. No.: 11/190,178

(22) Filed: Jul. 25, 2005

(65) Prior Publication Data

US 2005/0258428 A1    Nov. 24, 2005

Related U.S. Application Data

(62) Division of application No. 10/734,429, filed on Dec. 12, 2003.

(51) Int. Cl.
 *H01L 27/148* (2006.01)
(52) U.S. Cl. ............ 257/222; 257/225; 257/257; 257/290; 257/443
(58) Field of Classification Search ........... 257/222, 257/225, 257, 290, 443
See application file for complete search history.

(56) References Cited

U.S. PATENT DOCUMENTS

| | | | | |
|---|---|---|---|---|
| 4,488,164 A | | 12/1984 | Kazarinov et al. | 357/194 |
| 5,535,028 A | * | 7/1996 | Bae et al. | 349/145 |
| 6,300,988 B1 | | 10/2001 | Ishihara et al. | |
| 6,545,291 B1 | | 4/2003 | Amundson et al. | 257/40 |
| 7,115,507 B2 | * | 10/2006 | Kawase | 438/677 |
| 2002/0027229 A1 | | 3/2002 | Yamazaki et al. | |
| 2003/0141807 A1 | | 7/2003 | Kawase | |

OTHER PUBLICATIONS

H. Klauk, D. J. Gundlach, T. N. Jackson: Sub-75-μsec Pentacene Organic TFT Circuits, 56th Annual Device Research Conference Late News Digest, Jun. 1998.
M. H. Lu and J. C. Sturm, Optimization Of External Coupling And Light Emission in Organic Light-Emitting Devices: Modeling And Experiment, Journal of Applied Physics, Jan. 15, 2002, pp. 595-604, vol. 91, No. 2.
R. A. Street, Technology and Applications of Amorphous Silicon, Springer—Verlag, 1999.

* cited by examiner

*Primary Examiner*—Wai-Sing Louie (57) ABSTRACT

An improved transistor array for a display or sensor device is described. The display or sensor device includes a plurality of pixels. Each pixel includes a width and a length. Each pixel is addressed by a transistor. The transistor addressing each pixel has a channel with a channel width. Each channel width is greater than the width or length of the pixel being addressed. By fabricating transistors with extremely long channel widths, lower mobility semiconductor materials can easily be used to fabricate the display device.

5 Claims, 8 Drawing Sheets

THIN-FILM TRANSISTOR ARRAY WITH RING GEOMETRY

CROSS-REFERENCE TO RELATED APPLICATIONS

This is a divisional of U.S. application Ser. No. 10/734,429 filed Dec. 12, 2003 by the same inventors, and claims priority therefrom. The original U.S. patent application Ser. No. 10/734,429 is hereby incorporated by reference in its entirety. This divisional application is being filed in response to a Restriction Requirement in that prior application.

This invention was made with United States Government support under Cooperative Agreement No. 70NANBOH3033 awarded by the National Institute of Standards and Technology (NIST). The United States Government has certain rights in the invention.

BACKGROUND

Thin-film transistor array backplanes for applications such as flat-panel display systems and image sensors have become increasingly prevalent. However, the displays and image sensors using such backplanes remain quite complex and expensive. One of the reasons for the high expense is the use of conventional photolithographic and thin-film deposition processes are often used to fabricate the transistor array backplanes.

In order to lower the cost, alternative processes and materials have been explored. One area of research has been using organic and polymeric semiconductors to replace the traditional silicon-based transistors. However, carrier mobility in organic and polymeric semiconductors, especially solution processable semiconductors, is often lower than carrier mobility in amorphous and crystalline silicon structures. The lower carrier mobility results in slower switching speeds and lower drive currents compared to traditional silicon-based semiconductors. Thus the performance of organic and polymeric thin-film transistors are typically below that of thin-film transistors made from more traditional materials such as amorphous silicon.

Thus a structure or method of improving the performance of organic and polymeric semiconductor transistors is needed.

SUMMARY

A thin-film transistor array for use as an addressable electronic backplane is described. The array is formed from a repetitive arrangement of unit cells or pixels that includes a thin-film transistor used to drive an overlying media. The pixel includes at least two dimensions, a width and a length. The thin film transistor is shaped such that a transistor channel width exceeds the shorter of either the width or length of the pixel.

DETAILED DESCRIPTION

Figure 1:
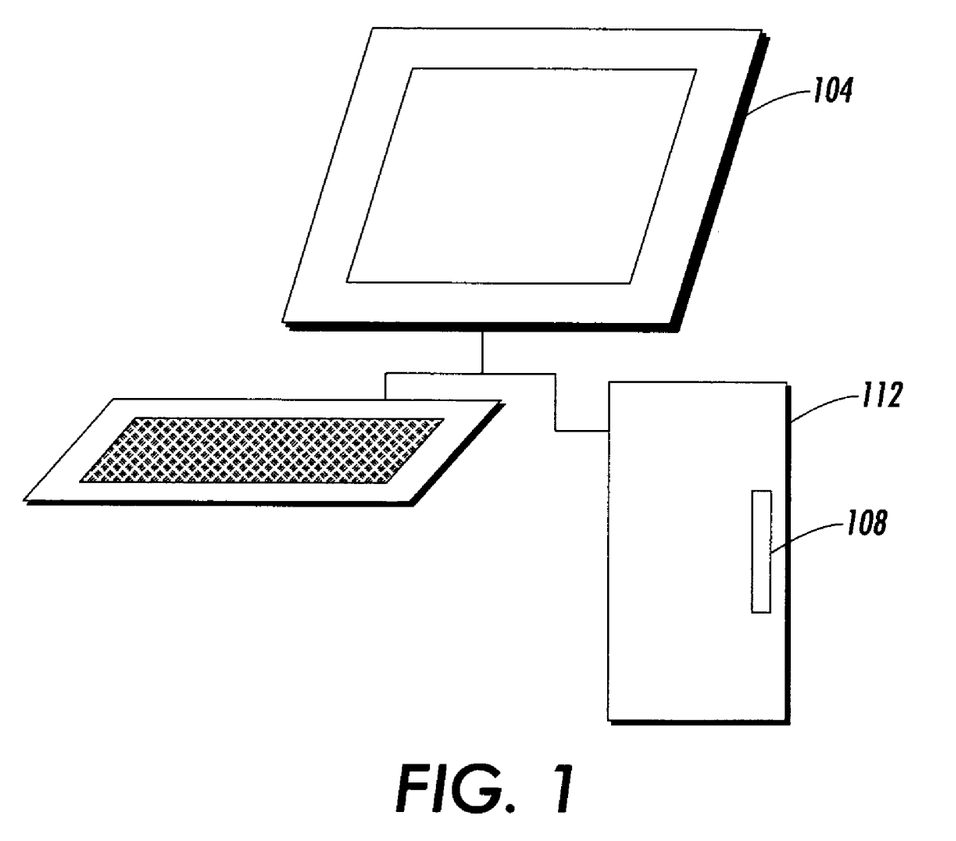
FIG. 1 shows a typical display device coupled to drive electronics.

An improved transistor array backplane is described. The transistor array backplane can be used to drive media for display applications or sensors for image sensing. FIG. 1 shows drive electronics coupled to a typical display device 104. In the illustrated embodiment, drive electronics include a video driver card 108 in a computer 112. Display device 104 receives signals from video driver card 108 and renders images on a screen for a viewer. Although a video driver card is shown, any circuit used to control a display may be used, including but not limited to a television, DVD player or other display controlling device.

Figure 2:
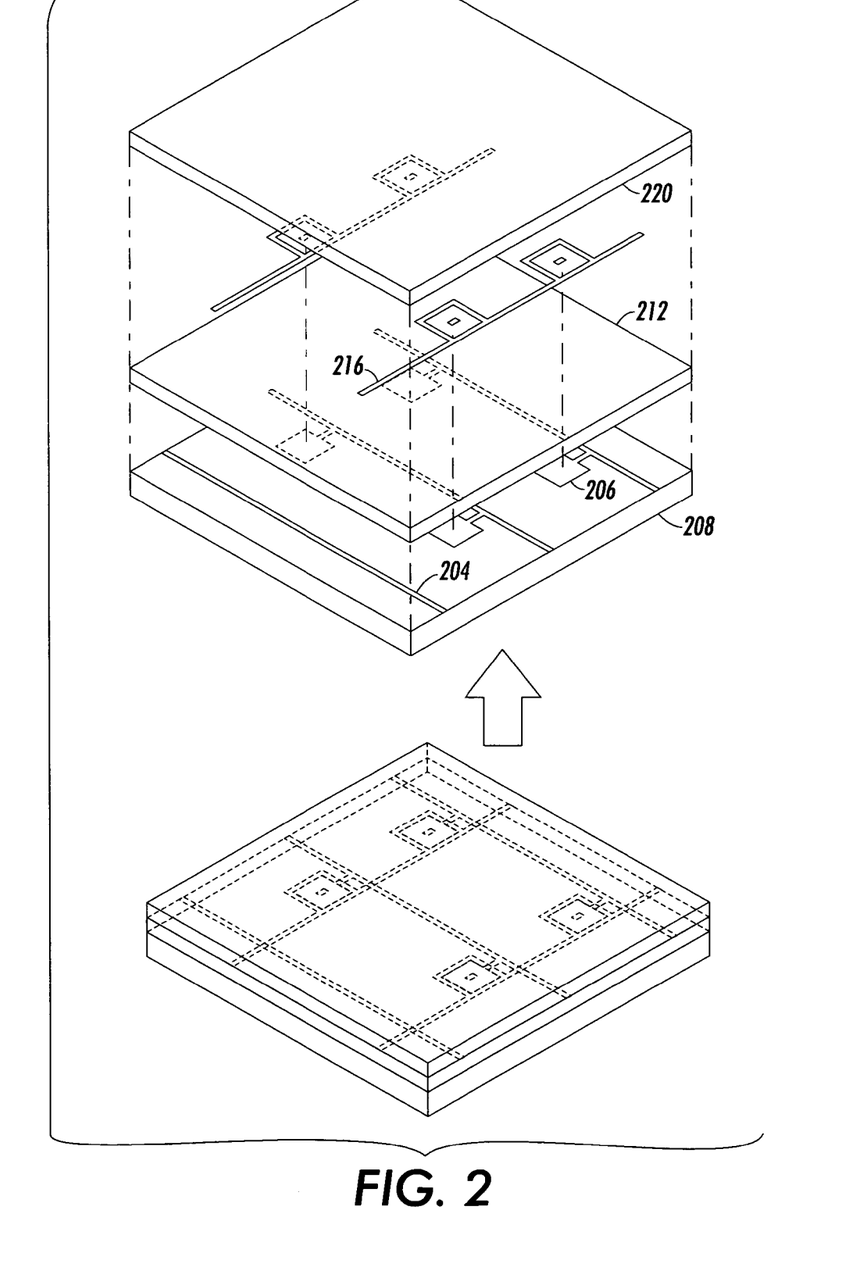
FIG. 2 shows a layered display structure including a transistor layer to drive pixels in a media layer

FIG. 2 shows an expanded view of the active device array used in a display structure. The active devices are arranged in rows and columns that define a pixel. Typically buslines 204 and associated first electrodes 206 are formed on a substrate layer 208. The buslines carry signals from the drive electronics and provide electrical voltages to first electrodes 206. In one embodiment, the first electrode may be a gate electrode.

A thin film transistor heterostructure layer 212 is formed over substrate layer 208. The thin film transistor hetrostructure layer (hereinafter TFT layer) includes several transistor components including a semiconductor layer, a dielectric layer, and a second and a third electrode. In one embodiment, the second and third electrodes may be source and drain electrodes. A channel region is disposed between the second and third electrodes. The channel may be of arbitrary shape, but is typically formed to overlap the position of the first electrode in substrate layer 208.

An electric potential on the first electrode controls transistor switching. When an electric potential is applied to the first electrode, the electric field in the first electrode causes a change in transconductance of the semiconductor layer, forming a conductive channel, adjacent to the dielectric layer and first electrode. The conductive channel allows current to flow from the second electrode to the third electrode. When the electric potential is removed from first electrode, the channel is no longer conductive and the transistor is in an "off" state. In another embodiment, the channel layer does not extend the entire length between the second and third electrode. This embodiment is typical for high voltage thin-film transistors.

In the illustrated embodiment, buslines in a data line layer 216 are deposited over the TFT layer. Data lines carry an electrical signal from drive electronics to the transistor source electrodes in TFT layer 212. An encapsulation layer is formed over the data line layer to isolate the TFT layer. A media layer 220 is deposited over the encapsulation layer. In one embodiment, patterned vias etched into the encapsulation layer connect the TFT layer with the media layer. The pixels switched by transistors in TFT layer 208 are defined by the boundaries of the buslines. The media may be made from liquid crystals, electrophorectic inks, amorphous Si, particle dispersed liquid crystals, light-emitting semiconductors, or other materials known in the art. In an array backplane for a display, a voltage output from a transistor determines the state of a pixel causing the pixel to convert to a state that either generates or improves the transmission or reflection of light. In an image sensing array, the transistor switches to determine the voltage input from the sensing media.

As used herein, the pixel is the smallest addressable unit in an array of elements. The shape and dimensions of a pixel may vary, however, in many arrays the spacing of the bus-lines, e.g. gate lines and the data lines, determines the pixel dimensions. Often, adjacently spaced gate lines and adjacently spaced data lines form the approximate borders of a pixel. However, it is not required that the data line and gate lines bound the pixel; pixel structures that overlap gate and data lines are available.

A detailed description of forming transistor and transistor arrays and using the arrays as addressable backplanes may be found in Technology and Applications of Amorphous Silicon (Editor: R. A. Street, Springer-Verlag, 1999), which is hereby incorporated by reference in its entirety. Although an example display has been described, it should be recognized that other methods and arrangements for forming thin film transistors to drive a display are available. For example, the gate lines may be formed over the TFT layer and the data lines under the TFT layers. The same techniques may also be used to form equivalent structures such as sensors where the pixels detect the incidence of photons rather than reflect or alter the transmission of light. Thus the invention should not be limited to the specific structure previously described.

Figure 3:
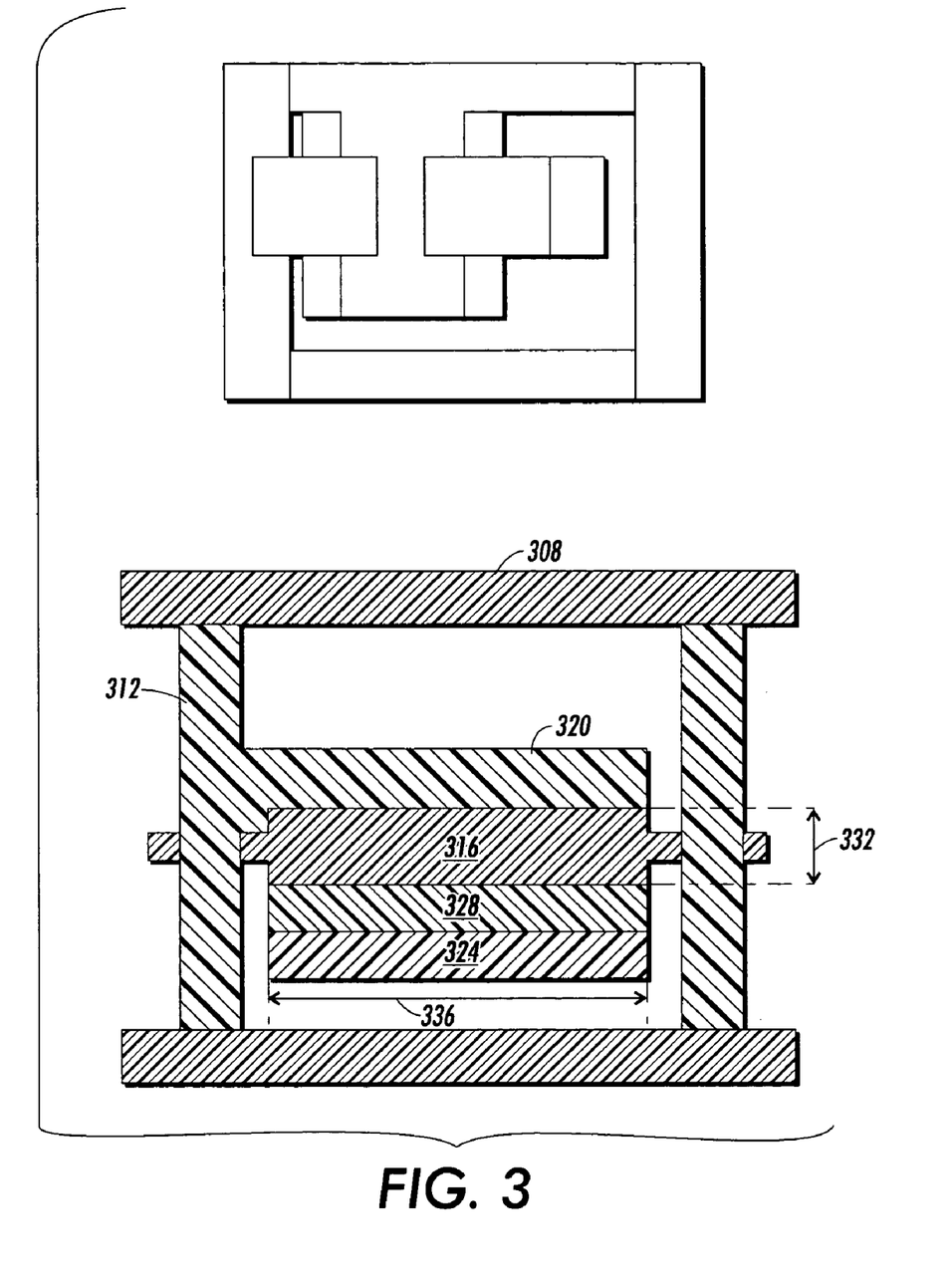
FIG. 3 shows a top view of a thin film ring transistor with a channel.

FIG. 3 shows a thin film transistor 304. A gate line 308 and a data line 312 addresses thin film transistor 304. The thin film transistor includes a channel 316 having a length 332 and a width 336. As used herein, channel region is broadly defined as the semiconductor region between two electrodes, control of the channel controls the flow of electrons between the two electrodes. In a field effect transistor, these two electrodes are a source and a drain. The length of the channel is defined as the direction of current flow between the electrodes, typically the direction of electron flow between a transistor source and a transistor drain. The channel width is defined as the channel dimension perpendicular to the direction of electron or current flow. In measuring the width of a curved transistor, some ambiguity exists because the measured width will be different depending on where in the channel the width is measured. For purposes of this invention, the width is measured in the center of the channel. Thus the width is measured by a line that bisects the length of the channel.

In transistor 304, current flows from electrode 320 through channel 316 to electrode 324. A voltage applied to electrode 328 controls the current flow. The operation of such transistors is described in Technology and Applications of Amorphous Silicon (Editor: R. A. Street, Springer-Verlag, 1999), which is hereby incorporated by reference.

In a display system, each transistor usually addresses a pixel. Pixel state depends on a voltage applied to the pixel. The media in the pixel, in a first state, either generates, transmits or reflects light. In a second state, the same media in pixel blocks or absorbs light.

In color systems, pixels often include a plurality of sub-pixels. For example, in order to generate color, a pixel may be divided into three sub-pixels. Each sub-pixel may correspond to a basic or primary color and may be individually addressed by a corresponding transistor. When a square pixel is desired each sub-pixel may be rectangular in shape with a three to one aspect ratio such that together, three sub-pixels form a square pixel. Monochromatic systems often do not utilize sub-pixels, instead using a single square pixel in which a width equals a length.

Although square pixels are more common, other sizes and shapes may be used. The actual dimensions and shape of a pixel may vary widely according to the size and resolution of the display, but as previously described, usually the dimensions of each pixel in a display is bounded or confined to the area between adjacent gate lines and adjacent data lines.

As previously described, transistors formed from low mobility semiconductors suffer from slower response times and higher voltages for switching. Increasing the width to length ratio of the channel partially compensates for the lower mobility. In one embodiment, transistors made from organic or polymeric semiconductor having electron mobilities below 0.5 $cm^2$/Volt-second have low switching speeds and low drive current. The drive current of the device is improved by increasing the channel width to length ratios. FIGS. 4-8 show various geometry TFT channel structures that increase the ratio of width to length in a pixel by forming at least one bend or curve in the channel.

Figure 4:
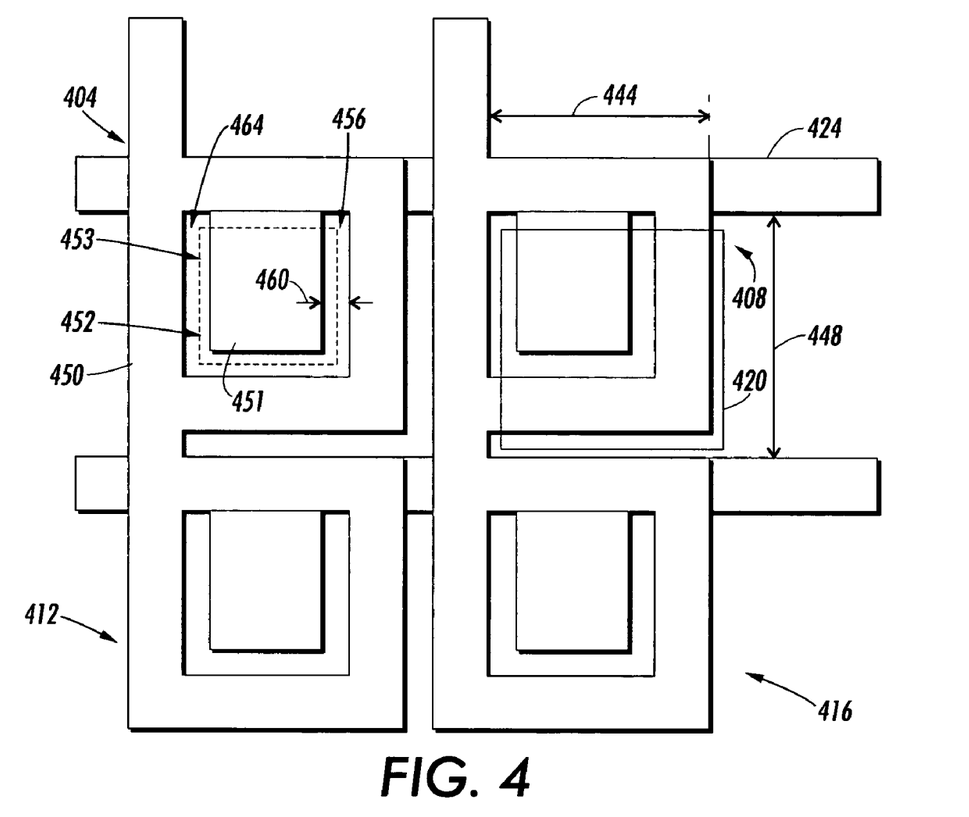
FIG. 4 shows a top view of four thin film ring transistor, each thin film transistor is coupled to a pixel.

FIG. 4 shows a top view of a layout for four transistors 404, 408, 412, 416. Each transistor addresses a corresponding pixel, for example, transistor 408 may address pixel 420. Voltages applied to gate lines 424 controls switching of transistor 404. Pixel 420 has dimensions including a pixel width 444 and a pixel length 448. Typically pixel widths and lengths range from 85 to 500 microns for displays. Typical sensor pixel dimensions can range down to 1 micron, although the provided dimensions are for reference only and other sizes may be fabricated as needed.

Each transistor such as transistor 404 includes a channel 452 separating electrode 450 and electrode 451. In the illustrated embodiment, channel 452 is a closed structure that completely encircles electrode 451. Closed structures that isolate the drain help minimize leakage currents. Channel 452 has a length 460 which is parallel to the direction of current flow and usually the shortest distance from the electrode 450 to the electrode 451. Channel 452 also has a width 456, a dimension perpendicular to the direction of current flow and illustrated by a line 453 running along the center of channel 452 and bisecting length 560. As shown the width substantially exceeds the length. Bends, such as channel bend 464, also help to enable the channel width to exceed linear dimensions (either pixel length or pixel width) of pixel 420. Transistor 404 addresses pixel 420.

Figure 5:
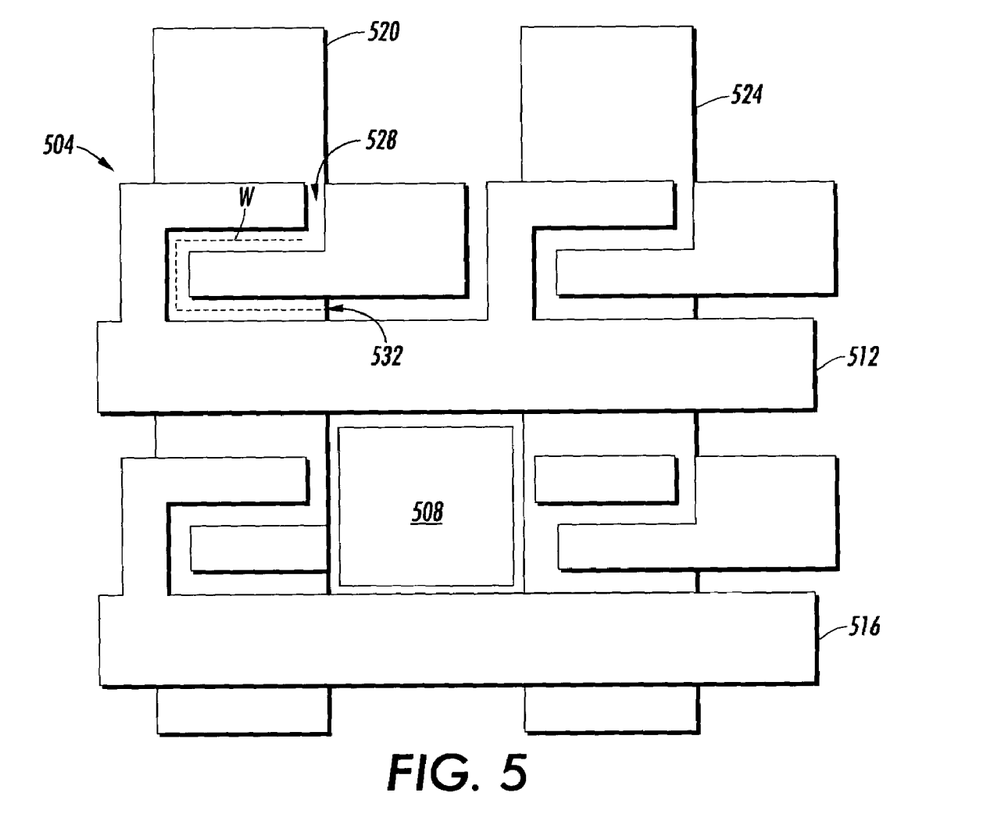
FIG. 5 shows an alternative embodiment of a thin film transistor with an open circle design

FIG. 5 shows an alternative open "circle" design of the transistor for use in a display device. In an open design, the drain is not completely encircled by the channel. A pixel 508 addressed by transistor 504 lies between the adjacent gate lines 512, 516 and adjacent data lines 520, 524. The transistor includes a channel 528 where the channel width shown as dotted line 532 exceeds a dimension of the pixel addressed by the transistor.

Figure 6:
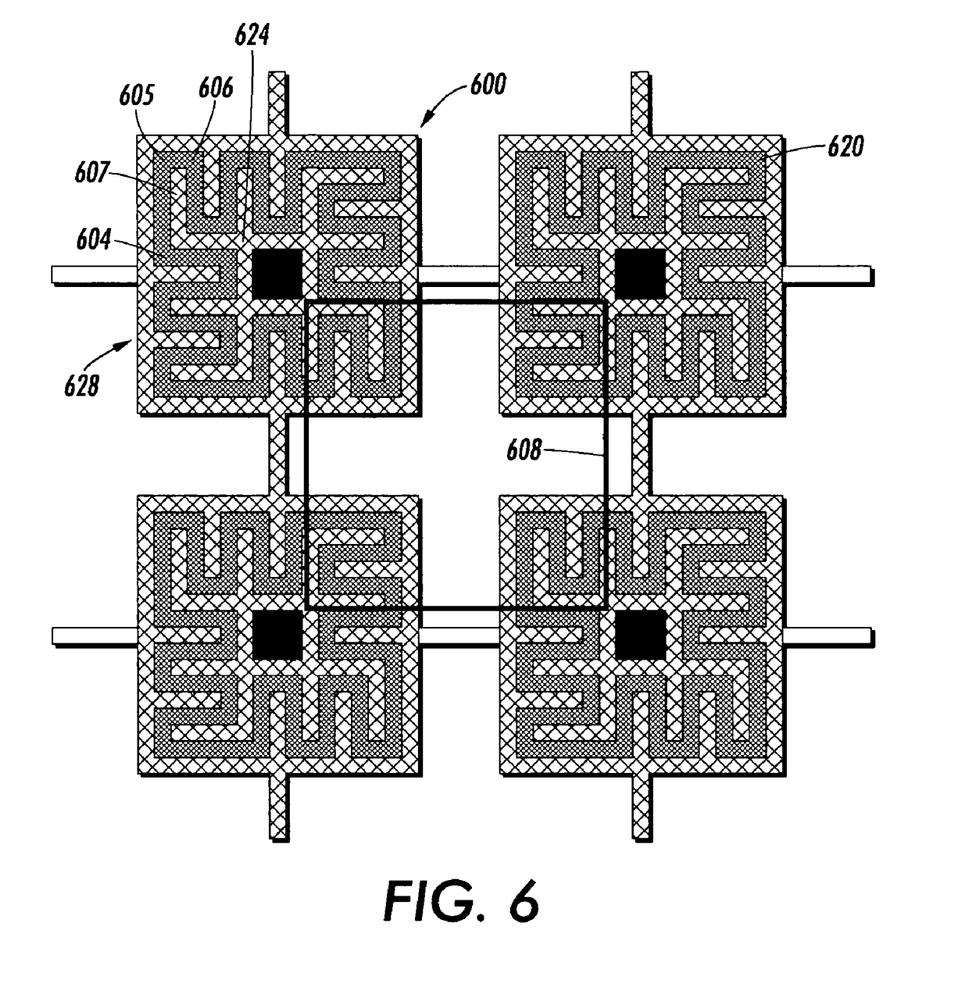
FIG. 6 shows a corbino ring transistor geometry including interdigitated structures.

Additional increases in the width to length ratio may be achieved by adding bends or curve in the channel structure. Adding multiple bends enables channel width to length ratios in excess of 100. FIG. 6 shows a top view of a geometry having interdigitated electrode-channel-electrode layout that offers higher width to length ratios. As used herein, interdigitated means that channel 604 includes at least two significant bends, such as bends 605, 606 such that channel 604 surrounds on three sides a section 607 of electrode 624 or electrode 628. Region 607 which is surrounded on three sides is referred to as the "digit".

In FIG. 6, each transistor such as transistor 600 switches a corresponding pixel 608. In one embodiment, pixel 608 has dimensions of approximately 17×17 unit cells. The width of a channel 620 is typically between 100 and 1000 microns. In the embodiment shown, the approximate width to length may exceed 100, and is often around 120.

Larger area transistors may interfere with the pixel output, particularly in backlit displays, such as conventional twisted nematic liquid crystal displays. In such display designs, image quality can sometimes be improved by increasing the aperture size of the pixel. One way to increase aperture size is to use transparent conductor pixel pads that allow light to pass through parts of the transistor and the pixel pads. When opaque gate lines are used, minimizing gate line and source/drain overlap can also help to maximize light transmission through the transistor. Such transparent transistor structures are described in "Optimization of External Coupling and Light Emission in Organic Light-Emitting Devices: Modeling and Experiment", J. Appl. Phys. Vol. 91, No. 2 pp. 595-604 by Lu and Sturm (2002) which is hereby incorporated by reference.

Figure 7:
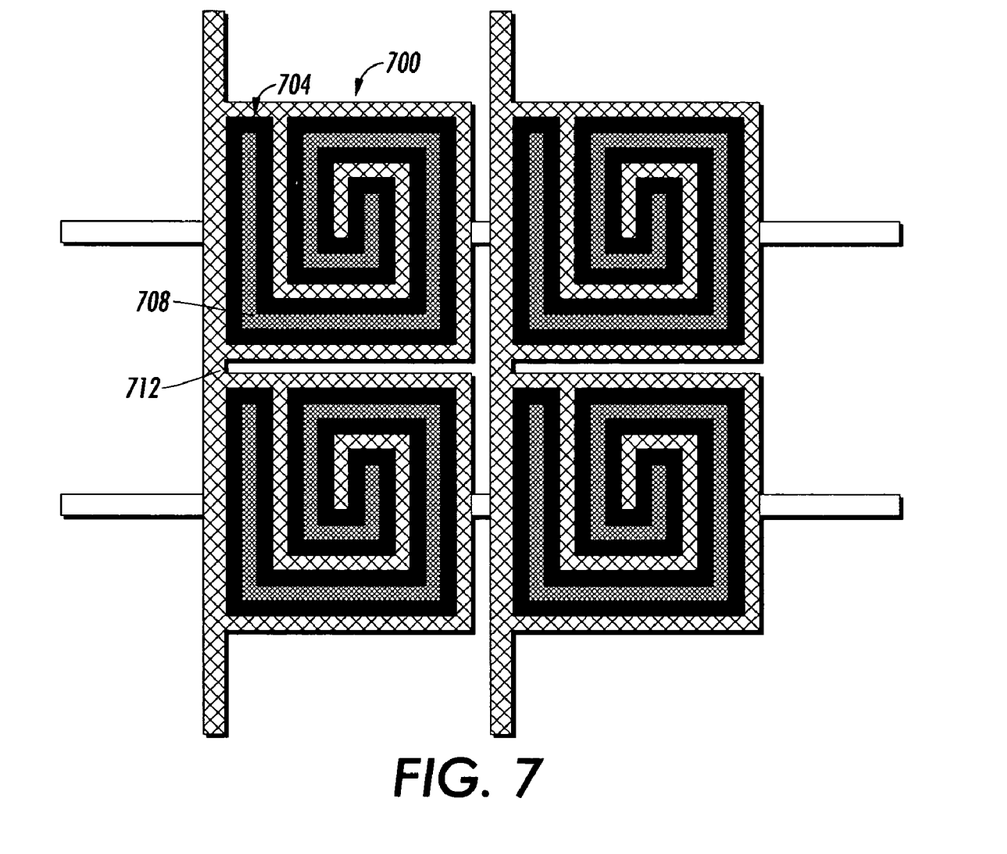
FIG. 7 shows a top view of a transistor utilizing a closed spiral channel.

FIG. 7 shows an alternate transistor 700 that uses a spiral pattern for a channel. In FIG. 7, a spiral channel 704 surrounds a spiral electrode 708 in a closed geometry. A first electrode typically controls the conductivity of spiral channel 704. In one embodiment, the first electrode is also spiral shaped. A spiral source 712 provides a source of current to transistor 700. The illustrated spiral patterns also enable width to length ratios in excess of 100.

Figure 8:
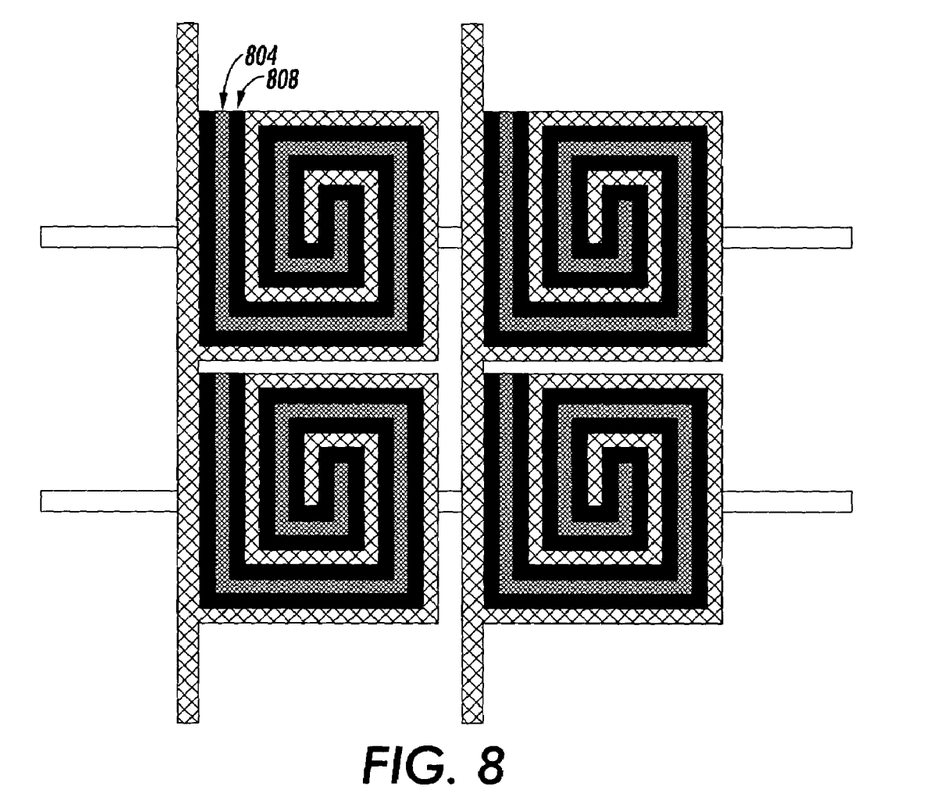
FIG. 8 shows an alternate embodiment of a transistor including an open spiral channel.

Many variations are possible on the spiral pattern. For example, FIG. 8 shows an open geometry in which electrode 804 is not completely surrounded by a channel 808.

Although a number of details have been provided in the specification, such details are provided as examples and to facilitate an understanding of the invention and should not be interpreted to limit the invention. Indeed, the details of the invention may be amended to encompass variations, alternatives, modifications, improvements, equivalents, and substantial equivalents of the embodiments and teachings disclosed herein. Thus the scope of the invention should only be limited by the scope of the claims which follow and their equivalents.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A display device comprising:
    a plurality of gate lines;
    a plurality of data lines;
    a plurality of pixels, each pixel having a two dimensions including a corresponding pixel width and a corresponding pixel length; and,
    a plurality of thin film transistors, each thin film transistor to address a corresponding pixel, each thin film transistor in the plurality of thin film transistors including a semiconductor in an active region, the semiconductor forming the active region of each thin film transistor having a mobility less than 0.5 $cm^2$/Volt-second, each thin film transistor in the plurality of thin film transistors including a channel with a channel width, each channel width larger than the smallest dimension of the corresponding pixel addressed.

2. The display device of claim 1 wherein the semiconductor is polymeric semiconductor.

3. The display device of claim 1 wherein the semiconductor is an organic semiconductor.

4. The display device of claim 1 further comprising:
    an electronic circuit coupled to the plurality of gate lines and the plurality of drain lines, the electronic circuit to individually address each thin film transistor in the plurality of thin film transistors and to individually switch each transistor in the plurality of transistors to display an image.

5. The display device of claim 1 wherein the pixel pad is made from a transparent material to increase the aperture of the pixel.

\* \* \* \* \*

UNITED STATES PATENT AND TRADEMARK OFFICE
CERTIFICATE OF CORRECTION

PATENT NO. : 7,425,734 B2  
APPLICATION NO. : 11/190178  
DATED : September 16, 2008  
INVENTOR(S) : William S. Wong et al.

Page 1 of 1

It is certified that error appears in the above-identified patent and that said Letters Patent is hereby corrected as shown below:

In the Specification

Column 1, line 14, after "Cooperative Agreement No.", please delete "70NANBOH3033" and insert --70NANB0H3033--.

Signed and Sealed this  
Third Day of September, 2013

Teresa Stanek Rea  
*Acting Director of the United States Patent and Trademark Office*